United States Patent
Collins et al.

(10) Patent No.: US 7,958,219 B2
(45) Date of Patent: Jun. 7, 2011

(54) SYSTEM AND METHOD FOR THE PROCESS MANAGEMENT OF A DATA CENTER

(75) Inventors: Mark Collins, Dripping Springs, TX (US); John C. Pflueger, III, Austin, TX (US); Edgar R. Hernandez, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 239 days.

(21) Appl. No.: 12/142,461

(22) Filed: Jun. 19, 2008

(65) Prior Publication Data

US 2009/0319650 A1 Dec. 24, 2009

(51) Int. Cl.
*G06F 15/173* (2006.01)
(52) U.S. Cl. ......................................................... 709/223
(58) Field of Classification Search .................. 709/223
See application file for complete search history.

(56) References Cited

U.S. PATENT DOCUMENTS

| | | | |
|---|---|---|---|
| 2006/0015593 A1* | 1/2006 | Vytas et al. | 709/221 |
| 2006/0271341 A1* | 11/2006 | Brown et al. | 703/1 |
| 2006/0284489 A1* | 12/2006 | Gross et al. | 307/64 |
| 2009/0158081 A1* | 6/2009 | Dake et al. | 714/3 |

OTHER PUBLICATIONS

Dell Unified Manageability Architecture, Oct. 20, 2006, pp. 4-8 available at http://www.dell.com/downloads/global/corporate/media/dell_unified.pdf?c=3Dj=.
Pflueger et al, Data Center Efficiency in the Scalable Enterprise, Dell Power Solutions, Feb. 2007, pp. 8-14 available at http://www.dell.com/downloads/global/power/ps1q07-20070210-CoverStory.pdf.

* cited by examiner

*Primary Examiner* — Krisna Lim
(74) *Attorney, Agent, or Firm* — Baker Botts, L.L.P.

(57) ABSTRACT

An architecture for a data center is disclosed that manages the computational, power, and cooling elements of the data center according to a feedback process control function in which the operation of the data center is continuously monitored and adjusted according to monitoring data collected from the data center and a set of business rules concerning the operation of the data center.

20 Claims, 3 Drawing Sheets

SYSTEM AND METHOD FOR THE PROCESS MANAGEMENT OF A DATA CENTER

TECHNICAL FIELD

The present disclosure relates generally to computer systems and information handling systems, and, more particularly, to a system and method for managing the process controls of a data center.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

A group of information handling systems may be included within a data center. A data center will typically include multiple computers systems, which may be arranged in racks. The racks are typically arranged in rows. Each computer system will typically generate heat, and the concentration of a number of computer systems in the defined space of a data room will generate a substantial amount of heat. The room that houses the data center may include an air conditioner or other ventilation system to remove the heat that is generated by the computer system. One difficulty of the management of a data center is that the management of the data center is not integrated across the functions of the data center, including the cooling function, the power management function, and the processing function of individual server units or the collective set of server units.

In the absence of the centralized management of the cooling, power, and processing functions, the data center may not perform optimally. The data center may consume excess power to cool the data center and exhaust heated air from the interior of the data center. In addition, the data center may not efficiently balance the processing loads of each of the server units of the data center, thereby concentrating too much of the processing load in a subset of server units, which may cause the server units to function and process data at less than an a maximum rate. In addition, the inefficient use of cooling and workload functions may cause the excessive and costly draw of power from the power resources of the computer system.

SUMMARY

In accordance with the present disclosure, an architecture for a data center is disclosed that manages the computational, power, and cooling elements of the data center according to a feedback process control function in which the operation of the data center is continuously monitored and adjusted according to monitoring data collected from the data center and a set of business rules concerning the operation of the data center. The architecture includes a node management layer that monitors each element of the data center and is able to control the operation of each element of the data center. A resource management layer is provided that monitors and controls the function of the node management layer to distribute the computational, power, and cooling across the data center. The data center architecture also includes a services management layer that controls the operation of the resource management layer according to a set of business rules, historical data concerning the operation of the data center, and the anticipated capacity of the data center.

The data center described herein is technically advantageous because it provides for the integrated management of the operational elements of the data center. Because the control of the functions of the data center and are integrated, the adjustment of one operational element can be adjusted on the basis of the function of another operational element. The provision of integrated management of the data center allows for the automatic control of all of the elements of the data center. The control of the functions of the data center can be managed according to a set of business rules that govern the operation of the data center. The business rules can be followed on an automated basis by all of the operational elements of the data center. Because data center architecture provided herein is integrated and process-driven, cooling, power, and computational resources are managed and distributed predictively and automatically based on the analysis of multiple factors, including the operation of the resources of the data center, business rules, historical data, and anticipated capacity. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1:
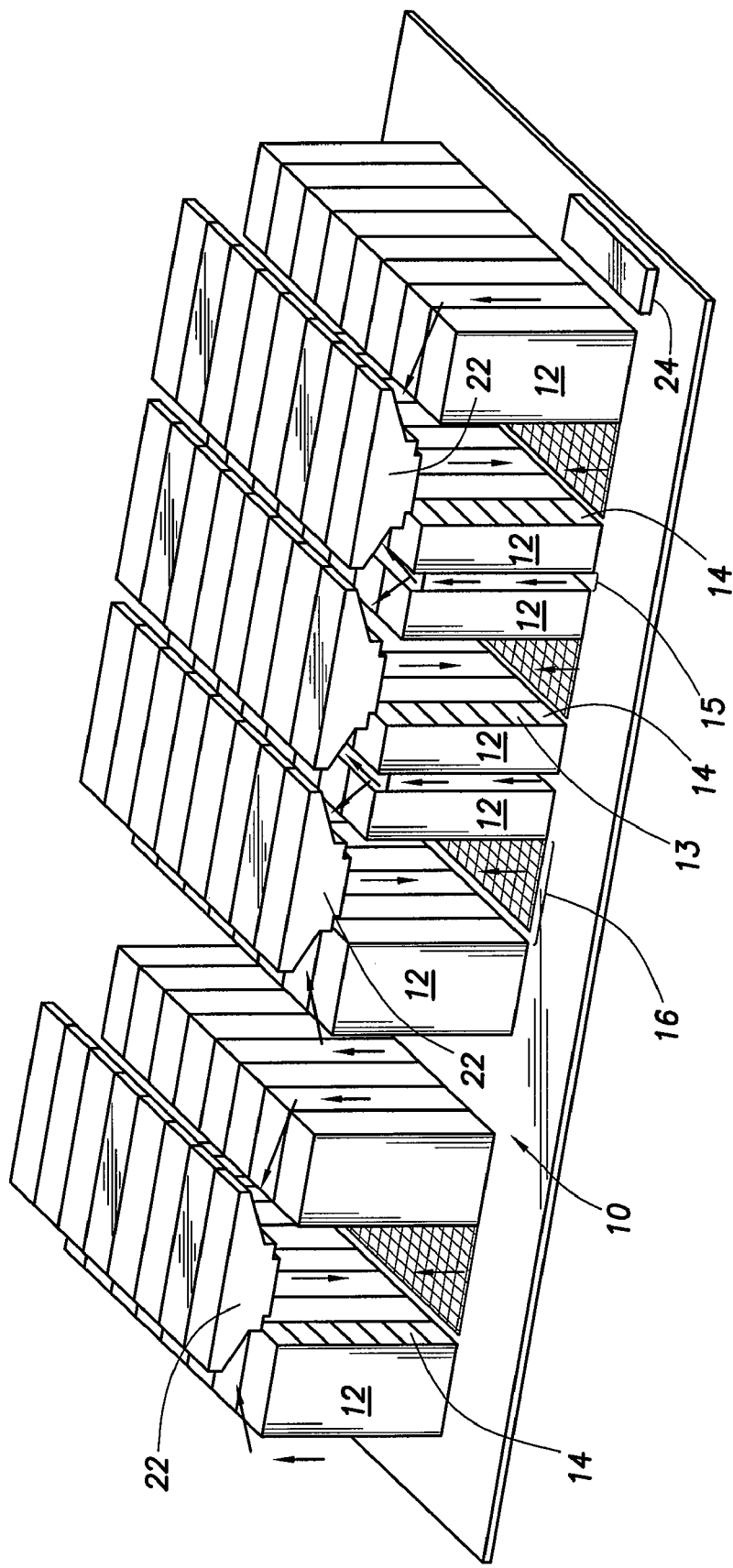
FIG. 1 is a pictorial view of a data center.

A plurality of information handling systems may be housed in a data center. Shown in FIG. 1 is a pictorial view of a data center, which is indicated generally at 10. The data center includes several rows of racks 12 of computer systems 14. Each rack typically includes several computer systems. The computer systems 14 may comprise communications servers, such as web servers. The computer systems 14 may also include storage servers, which provide an interface between a client and storage. The computer systems 14 may also comprise computational units, which provide a computational power that may be distributed across several computer systems. As indicated in FIG. 1, the racks 12 may be arranged so that racks are placed in a back-to-back configuration to promote the use of cool aisles 16 and hot aisles 15. The relatively narrow space between two adjacent racks is known as a hot aisle, which is characterized by the area in which heated air is expelled from the racks 15. As indicated by the arrows in FIG. 1, the heated air may be directed upward and away from the hot aisle 15. The relatively wide aisle between the racks is known as the cool aisle, as this is the aisle in which cooler air is present. As indicated in FIG. 1, cool air is directed in a downward direction into the cool aisle by the cooling units 22, which are positioned above each cool aisle in FIG. 1. In addition to cooling unit 22, data center 10 may include a computer room air conditioner (CRAC) 24 that manages the introduction of cooled air into the interior of the data center. Cooled air may be directed by CRAC 24 into the data center through the vents of cooling units 22.

Figure 2A:
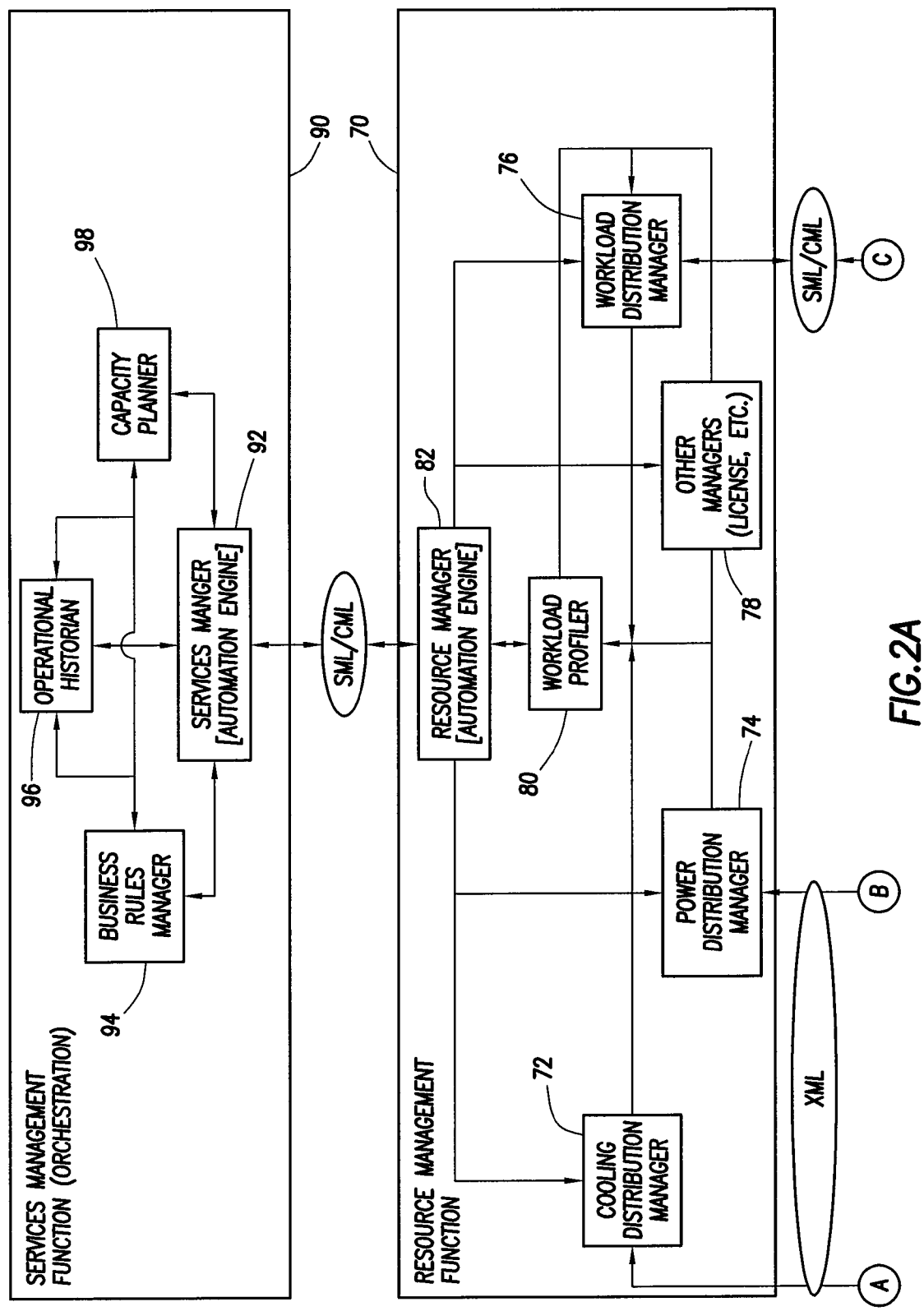
FIG. 2A is a diagram of the resource management layer and the service management layer of the architecture of a data center control system.
Figure 2B:
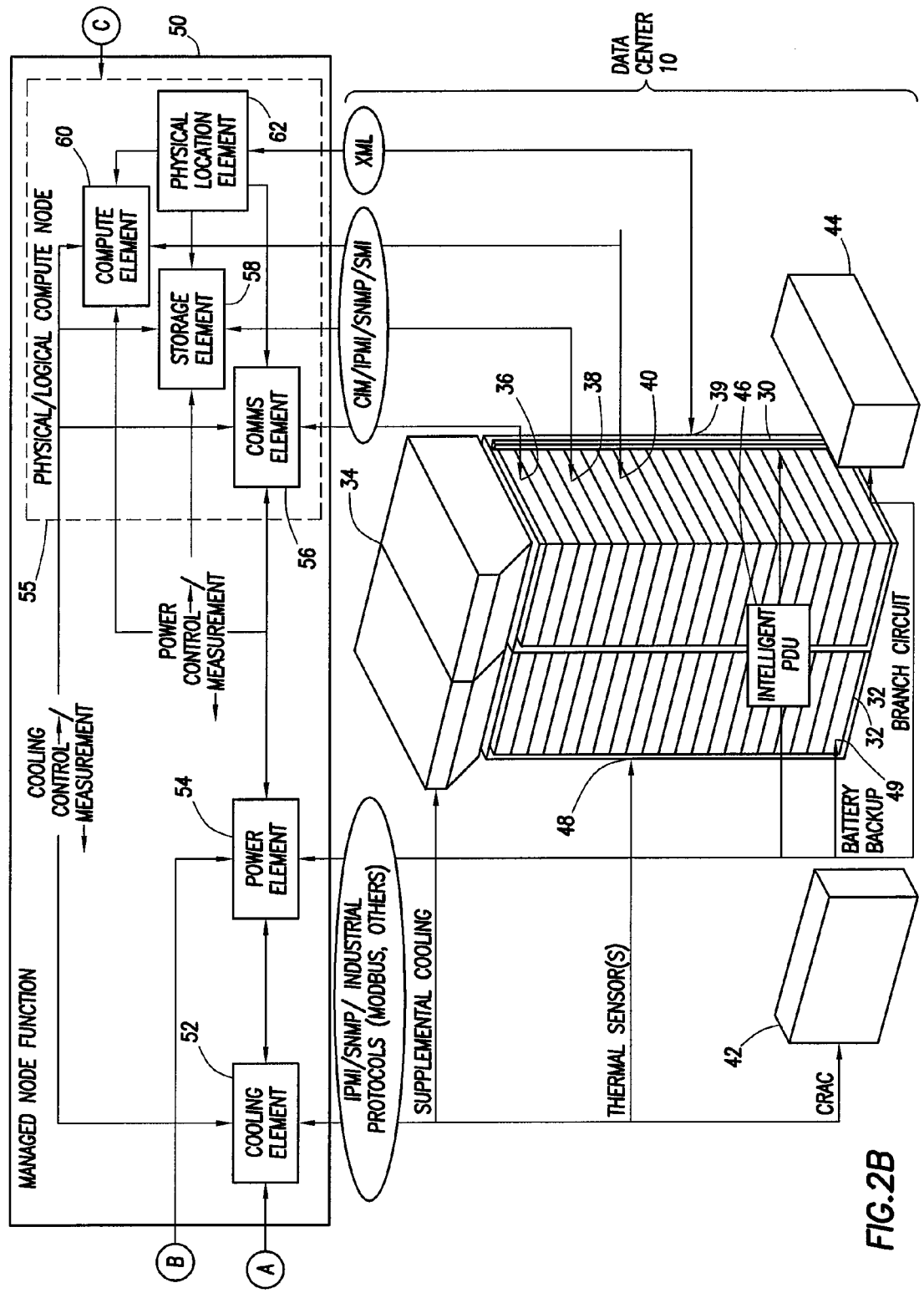
FIG. 2B is a diagram of a rack and the node management layer of the architecture of a data center control system.

Each rack in data center 10 is included within a data center architecture that manages the cooling, power, and data processing elements of the data center. Shown in FIG. 2 a diagram of a data center architecture that includes a rack 30. Rack 30 includes a pair of columns of computing systems 32. Above rack 30 is a supplemental cooling unit or cooling vent 34. Supplemental cooling unit 34 introduces cool air into the data center. Cooled air could also be introduced into the data center through vents in the floor of the data center. Cooling units, whether in the form of vents for introducing cooled air or cold plates, could also be integrated with the racks of the data center. Among the computing systems 32 included in rack 30 are a communications server 36, a storage server 38, and a computational server 40. Rack 30 may also include a physical processing unit 39 that acts as a global positioning system or orientation aid that identifies the physical location of rack 30 and whether rack 30 has moved and remains upright. Rack 30 also includes a power distribution unit 46 and one more thermal sensors 48. Rack 30 may also include a battery backup unit 49. Rack 30 and cooling unit 32 are included within a data center 10. A CRAC 42 and branch circuit 44 may also be included in data center 10. A branch circuit 44 is a supplementary power unit that is housed separately from the racks 30. Although only a single rack is depicted in FIG. 2, it should be appreciated that each rack of FIG. 1 is included in the architecture of FIG. 2 at the level of rack 30 shown in FIG. 2. The data center includes a number of architectural elements, including the computer systems of the rack, CRAC, cooling units, thermal sensors, power distribution units, branch circuit, and a physical processing unit.

The architecture of FIG. 2 includes a node management layer 50. Node management layer 50 controls and measure the operation of each managed function of the data center. Node management layer 50 includes a number of nodes and subnodes, which may be comprised of a combination of hardware and software elements. Node management layer 50 includes a cooling node 52, which measures the cooling and other operational parameters of the CRAC 42, thermal sensors 48, and supplemental cooling unit 34. Cooling node 52 is able to monitor and adjust the parameters of the cooling elements of the data center (CRAC 42, thermal sensors 48, and cooling unit 34). The cooling node is coupled to the cooling elements of the data center by a suitable communication protocol, which may include the Intelligent Platform Management Interface (IPMI), the Simple Network Management Protocol (SNMP), or ModBus. The IPMI, SNMP, and ModBus protocol are provided here as examples of suitable communication protocols; other suitable communication protocols could be used.

Node management layer 50 includes a power node 54 that collects parameters from the power and other operational parameters of the power elements of the data center. Power node 54 is coupled to and receives information from the intelligent power distribution unit 46, battery backup unit 49, and branch circuit 44. Like the operation of the cooling node 52, power node 54 is able to collect information from and adjust the operation of the power elements of the data center (intelligent power distribution unit 46, battery backup unit 49, and branch circuit 44). The power node is coupled to the power elements of the data center by a suitable communication protocol, which may include the IPMI, SNMP, or ModBus. The IPMI, SNMP, and ModBus protocol are provided here as examples of suitable communication protocols; other suitable communication protocols could be used.

Node management layer 50 also includes a logical node 55, which itself includes a number of processing subnodes, including a communications subnode 56, a storage subnode 58, a computational subnode 60, and a physical location subnode 62. Communications subnode 56 is coupled to the communications server units 36 of the data center. Storage subnode 58 is coupled to the storage server units 38 of the data center. Computational subnode 60 is coupled to the computational server units 40 of the data center, and physical location subnode 62 is coupled to the physical processing unit 39. Physical processing unit is able to identify physical characteristics concerning each server unit of the data center. These physical characteristics include the height of each server unit in the rack, the location of each rack in its row of the data center, and the location of each row in the data center. This data is transmitted from the phyiscal location subnode to each of the communications subnode 56, storage subnode 58, and computational subnode 60

Each of the subnodes of logical node 55 collect data from and adjust the performance of their respectively managed server units of the data center. The communications subnode 56, storage subnode 58, and computational subnode 60 may be coupled to their respectively managed server units of the data center by a suitable communication protocol, including IPMI, SNMP, Common Information Model (CMI), or the Intelligent Platform Management Interface (IPMI). The IPMI, SNMP, CMI, and IPMI are provided here as examples of suitable communication protocols; other suitable communication protocols could be used. In addition, Physical location subnode 62 may be coupled to the physical processing unit 39 by an XML interface, which is one example of a suitable interface.

Within node management layer 50, cooling node 52 communicates with power node 54 to adjust the operation of the cooling and power elements of the data center in response to the operating characteristics of the cooling and power elements of the data center. As on example, a decrease in power consumption in the data center may cause the cooling elements to reduce the amount of cooling in the data center. As another example, an increase in power consumption in the data center may cause the cooling elements to increase the cooling performance of the data center.

Cooling node 52 also communicates with the communications subnode 56, the storage subnode 58, and the computational subnode 60 of the node management layer. The communication link between the cooling nodes and the subnodes of the logical node 55 allow the operation of the cooling elements and the server units of the data center to be adjusted in response to directions or changes in the operation of the cooling elements and server units of the data center. As an example, a decrease in the available cooling capacity in the data center may lead to a reduction in the throughput or available capacity of the various server units of the data center. As another example, an increase in the operating speed or throughput of the server units may cause an increase in the cooling requirements of the cooling elements of the data center. Similarly, power node 54 communicates with the communications subnode 56, the storage subnode 58, and the computational subnode 60 of the node management layer. The interaction and communication between the power node 54 and the logical node 55 allows for the adjustment of the operation of the power elements and the server units of the data center in response to measurement of parameters of these units. An adjustment in power consumption in the data center can lead to a reduction in the operation of one of the subnodes.

The data center architecture of FIG. 2 also includes a resource management layer 70. Resource management layer 70 includes a number of resource managers, which may be composed of a set of hardware and software elements. The cooling node 52 of node management layer 50 is coupled to a cooling distribution manager 72 of the resource management layer through an XML communications link, which is one example of a suitable communications link. Cooling distribution manager 72 operates to distribute the cooling resources of the data center across the data center of FIG. 1 and to control the various cooling elements of the data center. The power node 54 of the node management layer 50 is coupled to a power distribution manager 74 of the resource management layer through an XML communications link. The function of the power distribution manager 74 is to control the individual power elements of the data center and to distribute the power resources of the data center across the needs of the entirety of the data center of FIG. 1. Logical node 55 of node management layer 50 communicates with a workload distribution manager 76 of the resource management layer 70 through an SML/CML (Service Modeling Language/Common Model Library) communications link. Workload distribution manager 76 controls the subnodes of logical node 55 and distributes the processing resources of logical node 55 across the entirety of the data center.

Cooling distribution manager 72 communicates directly with workload distribution manager 76 to balance the cooling needs of the data center against the processing workload of the data center. Through this coordination, the cooling performance of the data center can be adjusted in response to the processing performance of the data center, and the processing performance of the data center can be adjusted in response to the cooling performance of the data center. As shown in FIG. 2, the resource management layer may include other resource managers, as indicated at 78. One example is a license manager, which would control the licensed resources of the data center to control the number of licenses consumed or to apportion the number of allocated licenses against the needs of the data center. The license manager receives information from the workload distribution manager concerning the processing functions of the data center.

The power distribution manager 74 and the license manager 78 report to a workload profiler 80, which calculates a measure of actual and predicted workloads on the basis of information collected by the power distribution manager 74 and the workload distribution manager 76. The workload profiler communicates with a global resource manager 82, which, as indicated by the process control lines of FIG. 2, controls all of the resources of the data center through directions provided to the cooling distribution manager 72, power distribution manager 74, workload distribution manager 76, and other resource manager 78. Through this control, the global resource manager is able to control the operation of all of the resources of the data center. The resource management layer provides for management of the integrated and coordinated management of all of the resources of the data center, including cooling, power, and computational resources of the data center.

The data center architecture of FIG. 2 also includes a service management layer 90. The service management layer includes a number of operational elements, which may comprise a combination of hardware and software elements, that provide for orchestrated and automated process control of the data center. Global resource manager 82 communicates with a services manager 92 of the service management layer through an SML/CML communications network, which is one example of a suitable communications network. The services manager provides automated process control instructions to global resource manager 82 for managing the cooling, power, and computational resources of the data center. Services manager 92 communicate with and collects data and instructions from a business rules manager 94, an operations historian manager 96, and a capacity planning manager 98. Services manager 92 communicates with global resource manager 82 of resource management layer 70 to direct the use of cooling, power, and computational resources of the data center in accordance with the business rules, operational history, and planned capacity of the data center.

Business rules manager 94 maintains a database of business rules that are applied to the process control operation of the data center. The business rules set out in the business rules manager may set out operational limits that are applied in the data center, such as the maximum and minimum cooling volumes of the data center, or the limits on the throughput or the processing capacity of the computational elements of the data center. The business rules manager may also set limits on the operation of the power elements of the data center, including rules concerning when and for how long the data center operates on backup power. Business rules manager communicates with each of the services manager, operations, historian manager, and capacity planning manager.

Operations historian manager 96 maintains a log of the history of operations of the data center. Data concerning the cooling, power, and computational history of the data center is communicated through the architecture to the operations historian, which maintains a database of the historical operations of the data center. The services manager 92 receives historical data from the operations historian manager to make predictions about trends and future usage of cooling, power, and computational resources in the data center. In addition to communicating with the services manager, operations historian manager 96 communicates with the business rules manager and the capacity planning manager 98.

Capacity planning manager 98 uses data from the business rules manager 94 and the operations historian manager 96 to make planning predictions as to the capacity of the cooling, power, and computational elements of the system. Capacity planning manager also predicts the limits of the existing capacity of the cooling, power, and computational elements of the data center. Capacity planning manager may also make planning calculations to make predictions or recommendations about the future requirements for the cooling, power, and computational elements of the data center.

At each architectural layer of FIG. 2 (node management layer, resource management layer, and service management layer), the resources and operations of the previous architectural layer are monitored. The monitoring of the previous architecture level result in the creation of alerts and the subsequent modification of the operation of the components of the previous architecture level to address the alerts. The node management layer monitors the operation of the resource management layer. The resource management layer monitors the operation of the service management layer, and the service management layers monitors the operation of the cooling, power, and computational resources of the data center. In this manner, the integrated control of the resource of the data center is managed at both the micro and macro level through the architectural layers of the process control system described herein.

The data center control process described herein is feedback-driven. Changes to the operation of the data center may be made on an automated process on the basis of measured changes in the operation of the data center. A directive to make a change to the operations of the data center is made a systems-level basis and not always in response to a single parameter in the data center. In this way, the data center control and monitoring process described herein is better able to more efficiently monitor and control the operation of a data center. Because of the integrated, process-driven architecture described herein, cooling, power, and computational resources are managed and distributed predictively and automatically based on the analysis of multiple factors, including the operation of the resources of the data center, business rules, historical data, and anticipated capacity.

The data center architecture described herein will tend to reduce the cost of operation of a data center. System resources, including cooling and power resources, can be tailored to meet the needs of the data center, without necessarily expending those resources. In this manner, the resources needs of the data center are integrated with one another and are not wasted. Although the present disclosure has been presented in terms of a data center, it should be understood that the present disclosure may also apply to any other environment in which there is a combination of cooling, power, computational, and other resources that must be managed through integrated process control. Although the present disclosure has been described in detail, it should be understood that various changes, substitutions, and alterations can be made hereto without departing from the spirit and the scope of the invention as defined by the appended claims.

What is claimed is:

1. An architecture for a data center, comprising:
   a node management layer operable to monitor the operating parameters and control a function of operational elements of the data center;
   a resource management layer operable to monitor and control the functions of the node management layer; and
   a service management layer operable to monitor and control the functions of the resource management layer.

2. The architecture for a data center of claim 1, wherein the operational elements of the data center include a cooling element, a power element and a computational element.

3. The architecture for a data center of claim 1, wherein the node management layer is operable to communicate with an air conditioning unit of the data center and wherein the node management layer monitors and controls the operational elements of the data center on the basis of data collected from the air conditioning unit.

4. The architecture for a data center of claim 1, wherein the node management layer is operable to communicate with a thermal sensor of the data center and wherein the node management layer monitors and controls the operational elements of the data center on the basis of data collected from the thermal sensor.

5. The architecture for a data center of claim 1, wherein the node management layer is operable to communicate with a power element of the data center and wherein the node management layer monitors and controls the operational elements of the data center on the basis of data collected from the power element.

6. The architecture for a data center of claim 1, wherein the node management layer is operable to communicate with a computational element of the data center and wherein the node management layer monitors and controls the operational elements of the data center on the basis of data collected from the computational element.

7. The architecture for a data center of claim 1, wherein the service management layer controls the functions of the resource management layer on the basis of a set of business rules concerning the operation of the data center.

8. The architecture for a data center of claim 1, wherein the service management layer controls the functions of the resource management layer on the basis of a set of a set of historical data concerning the operation of the data center.

9. The architecture for a data center of claim 1, wherein the service management layer controls the functions of the resource management layer on the basis of the anticipated capacity of the data center.

10. The architecture for a data center of claim 1,
    wherein the node management layer controls the operational elements of the data center on the basis of feedback collected from the data center;
    wherein the resource management layer controls the node management layer on the basis of feedback from the node management layer; and
    wherein the services management layer controls the resource management layer on the basis of feedback from the resource management layer.

11. A method for managing the operation of a data center, comprising:
    monitoring and controlling the operating parameters of the operational elements of the data center at a node management layer;
    monitoring and controlling the function of the node management layer at a resource management layer, wherein the resource management layer distributes each of the operational elements across the data center;
    monitoring and controlling the function of the resource management layer at a services management layer, wherein the services management layer controls the function of the resource management layer according to a set of business rules.

12. The method for managing the operation of a data center of claim 11, wherein the operational elements of the data center include a cooling element, a power element and a computational element.

13. The method for managing the operation of a data center of claim 12, wherein the step of monitoring and controlling the operating parameters of the operational elements of the data center at a node management layer comprises receiving data from an air conditioning unit in the data center and monitoring and controlling the operational elements of the data center on the basis of data received from the air conditioning unit.

14. The method for managing the operation of a data center of claim 12, wherein the step of monitoring and controlling the operating parameters of the operational elements of the data center at a node management layer comprises receiving data from a power distribution unit in the data center and monitoring and controlling the operational elements of the data center on the basis of data received from the power distribution unit.

15. The method for managing the operation of a data center of claim 12, wherein the step of monitoring and controlling the operating parameters of the operational elements of the data center at a node management layer comprises receiving data from a computing system in the data center and monitoring and controlling the operational elements of the data center on the basis of data received from the computing system.

16. A system for managing a data center that includes a cooling element, a power element, and a computational element, comprising:
 a node management layer operable to monitor and control the operating parameters of the cooling element, the power element, and the computational element of the data center;
 a resource management layer operable to control the node management layer by distributing the cooling, power, and computational resources of the data center across the data center;
 a services management layer operable to control the resource management layer by applying a set of business rules governing the operation of the data center.

17. The system of claim 16, wherein the services management layer controls the resource management layer according to a set of historical data concerning the operation of the data center.

18. The system of claim 16, wherein the services management layer controls the resource management layer according to the anticipated capacity of the data center.

19. The system of claim 16, wherein the node management layer is operable to control cooling elements in the data center comprising an air conditioner and a supplemental cooling unit.

20. The system of claim 16, wherein the node management layer is operable to control power elements in the data center comprising a power distribution unit and a backup power unit.

* * * * *